(12) United States Patent
Lee et al.

(10) Patent No.: US 7,998,861 B2
(45) Date of Patent: Aug. 16, 2011

(54) METHOD OF MANUFACTURING THROUGH-VIA

(75) Inventors: Jong-jin Lee, Gwangju-si (KR); Hyun-seo Kang, Gwangju-si (KR); Jai-sang Koh, Gwangju-si (KR)

(73) Assignee: Electronics and Telecommunications Research Institute (KR)

( * ) Notice: Subject to any disclaimer, the term of this patent is extended or adjusted under 35 U.S.C. 154(b) by 35 days.

(21) Appl. No.: 12/604,355

(22) Filed: Oct. 22, 2009

(65) Prior Publication Data
US 2010/0136783 A1 Jun. 3, 2010

(30) Foreign Application Priority Data
Nov. 28, 2008 (KR) .................. 10-2008-0120131

(51) Int. Cl.
*H01L 21/768* (2006.01)
(52) U.S. Cl. ........ 438/667; 438/666; 438/637; 438/605; 257/E21.597; 257/587
(58) Field of Classification Search .......... 438/637–640, 438/668; 257/E21.577–E21.578, E21.585–E21.588
See application file for complete search history.

(56) References Cited

U.S. PATENT DOCUMENTS

| | | | |
|---|---|---|---|
| 5,804,504 A * | 9/1998 | Choi | 438/637 |
| 5,863,835 A * | 1/1999 | Yoo et al. | 438/666 |
| 6,221,769 B1 | 4/2001 | Dhong et al. | |
| 7,183,176 B2 | 2/2007 | Sankarapillai et al. | |
| 7,495,316 B2 * | 2/2009 | Kirby et al. | 257/621 |
| 7,863,189 B2 * | 1/2011 | Basker et al. | 438/667 |

FOREIGN PATENT DOCUMENTS
KR 10-2001-0001159 A 1/2001
KR 10-2005-0030720 A 3/2005

OTHER PUBLICATIONS

Ho, Soon Wee, et al., "Development of Coaxial Shield Via in Silicon Carrier for High Frequency Application," *2006 Electronics Packaging Technology Conference*, Institute of Microelectronics, Singapore, 2006, pp. 825-830.

* cited by examiner

*Primary Examiner* — N Drew Richards
*Assistant Examiner* — Mamadou Diallo
(74) *Attorney, Agent, or Firm* — Blakely, Sokoloff, Taylor & Zafman

(57) ABSTRACT

Disclosed is a method of manufacturing a through-via. The through-via manufacturing method includes forming a core-via hole in a wafer, forming a suction-via hole adjacent to the core-via hole in the wafer, forming a via core in the core-via hole, forming a polymer-via hole connected to the suction-via hole in the wafer, filling the polymer-via hole with polymer solution by creating a vacuum inside the polymer-via hole by drawing air out of the suction-via hole, and polishing the wafer such that the via core formed in the core-via hole is exposed.

17 Claims, 14 Drawing Sheets

METHOD OF MANUFACTURING THROUGH-VIA

CROSS-REFERENCE TO RELATED APPLICATION

This application claims the benefit under 35 U.S.C. §119(a) of Korean Patent Application No. 10-2008-0120131, filed on Nov. 28, 2008, the disclosure of which is incorporated by reference in its entirety for all purposes.

BACKGROUND

1. Field

The following description relates to a method of manufacturing a through-via, which passes through a silicon wafer to electrically connect circuits formed on an upper surface and a lower surface of the silicon wafer to each other.

2. Description of the Related Art

A through-via of a silicon wafer has been developed to achieve a 3-D stacking technology capable of increasing a packing density of electronic components by arranging a processor and a memory above/below each other on an upper surface and a lower surface of the silicon wafer. Recently, there has been keen competition for developing the 3-D stacking technology in packaging industry. A conventional system using silicon based electronic components has been constituted in 2-D constitution, and such a 2-D configuration system has limitations in increasing a packaging density. In addition, with a trend toward a merger of technologies, an intelligent system is required. Accordingly, many studies on integration degree have been conducted to achieve intelligent system. The degree of integration is increased by arranging the electronic components in a 3-D arrangement instead of a 2-D arrangement. In addition, a chip stacking technology through a wire bonding may be also used to increase the degree of integration in a system. Recently, the performance of a processor has been improved, and a memory, a graphic card and peripheral devices have a limitation in keeping up with input/output signal speed of the processor, resulting in a bottleneck phenomenon. In order to improve the input/output signal speed, a through-via is formed in the silicon wafer such that electronic chips are vertically stacked up against each other, thereby shortening a transmission line on layers and increasing the stacking density of input/output terminals. That is, the through-via allows the input/output speed of signals to be remarkably improved. In addition, a technology of reducing a thickness of a silicon wafer into 50 μm or below has been to developed to shorten the transmission line on layers such that transmission speed of signals is further improved.

Meanwhile, silicon carriers requiring a superior mechanical stability and optical components susceptible to external mechanical force include a silicon wafer provided in a great thickness of several hundred micrometers or above. In particular, a stress generated when the silicon wafer is deformed may cause optical characteristics of optical components to be changed, in which the optical components include an optical switch, an arrayed-waveguide grating (AWG) and an optical splitter based on a planer lightwave circuit (PLC). As a result, the insertion loss is increased or the index of refraction is changed so that the optical path is changed. In this regard, the silicon wafer needs to have a substantial thickness greater than several hundred micrometers. For this reason, a through-via needs to have a great depth, and needs to be insulated. In addition, a silicon wafer, which has a maximum electric resistance of about $10^4$ Ωcm, causes a loss of signal power when transmitting input/output signals, and thus is not suitable for high speed transmission.

SUMMARY

Accordingly, in one aspect, there is provided a method of manufacturing a through-via which passes through a silicon wafer such that circuits formed on an upper surface and a lower surface of the silicon wafer are electrically connected to each other.

In one general aspect, there is provided a method of manufacturing a through-via. The method includes forming a core-via hole in a wafer; forming a suction-via hole adjacent to the core-via hole in the wafer; forming a via core in the core-via hole; forming a polymer-via hole connected to the suction-via hole in the wafer; filling the polymer-via hole with polymer solution by creating a vacuum inside the polymer-via hole by drawing air out of the suction-via hole; and polishing the wafer such that the via core formed in the core-via hole is exposed.

Other features will become apparent to those skilled in the art from the following detailed description, which, taken in conjunction with the attached drawings, discloses exemplary embodiments of the invention.

BRIEF DESCRIPTION OF THE DRAWINGS

FIGS. 3A to 3F are cross sectional views illustrating an exemplary method of manufacturing an exemplary through-via, in which FIG. 3A is a cross sectional view illustrating a core-via hole and a suction-via hole formed in a wafer, FIG. 3B is a plan view illustrating the core-via hole and a suction-via hole formed in the wafer shown in FIG. 3A, FIG. 3D is a cross sectional view illustrating a process of forming a via core, FIG. 3E is a cross sectional view illustrating a process of forming a polymer-via hole and then filling polymer into the polymer-via hole, and FIG. 3F is a view illustrating a process of polishing a wafer.

Elements, features, and structures are denoted by the same reference numerals throughout the drawings and the detailed description, and the size and proportions of some elements may be exaggerated in the drawings for clarity and convenience.

DETAILED DESCRIPTION

The detailed description is provided to assist the reader in gaining a comprehensive understanding of the methods, apparatuses and/or systems described herein. Various changes, modifications, and equivalents of the systems, apparatuses, and/or methods described herein will likely suggest themselves to those of ordinary skill in the art. Also, descriptions of well-known functions and constructions are omitted to increase clarity and conciseness.

Hereinafter, a method of forming a general through-via will be described.

FIGS. 1A to 1D are cross sectional views illustrating a method of manufacturing a conventional through-via.

Figure 1A:
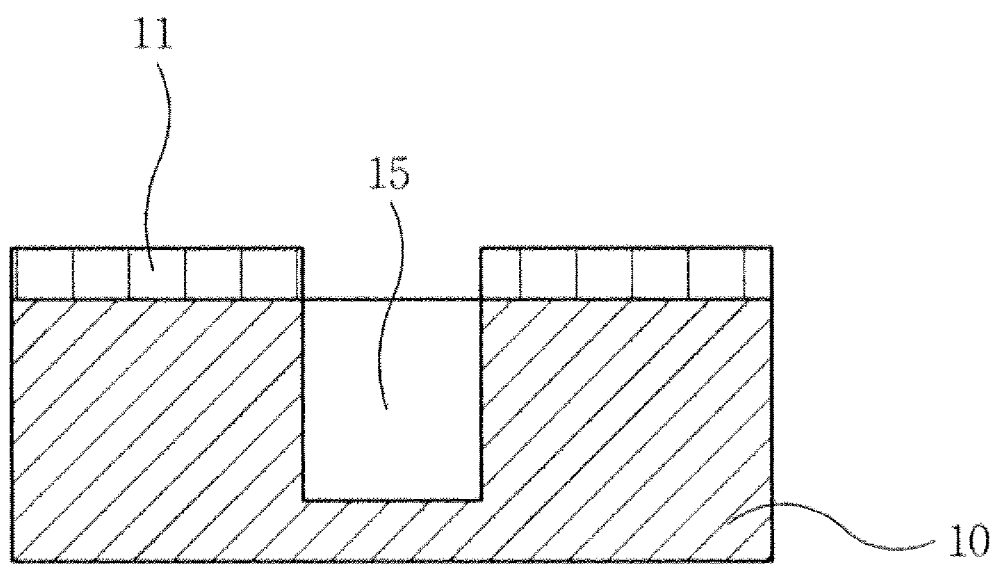
FIGS. 1A to 1D are cross sectional views illustrating a method of manufacturing a conventional through-via.
Figure 1A:
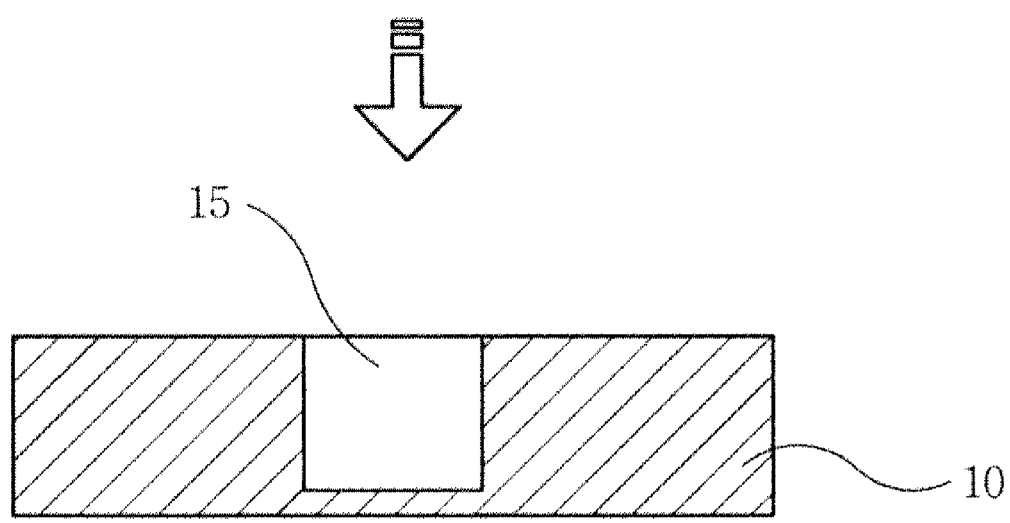
Figure 1B:
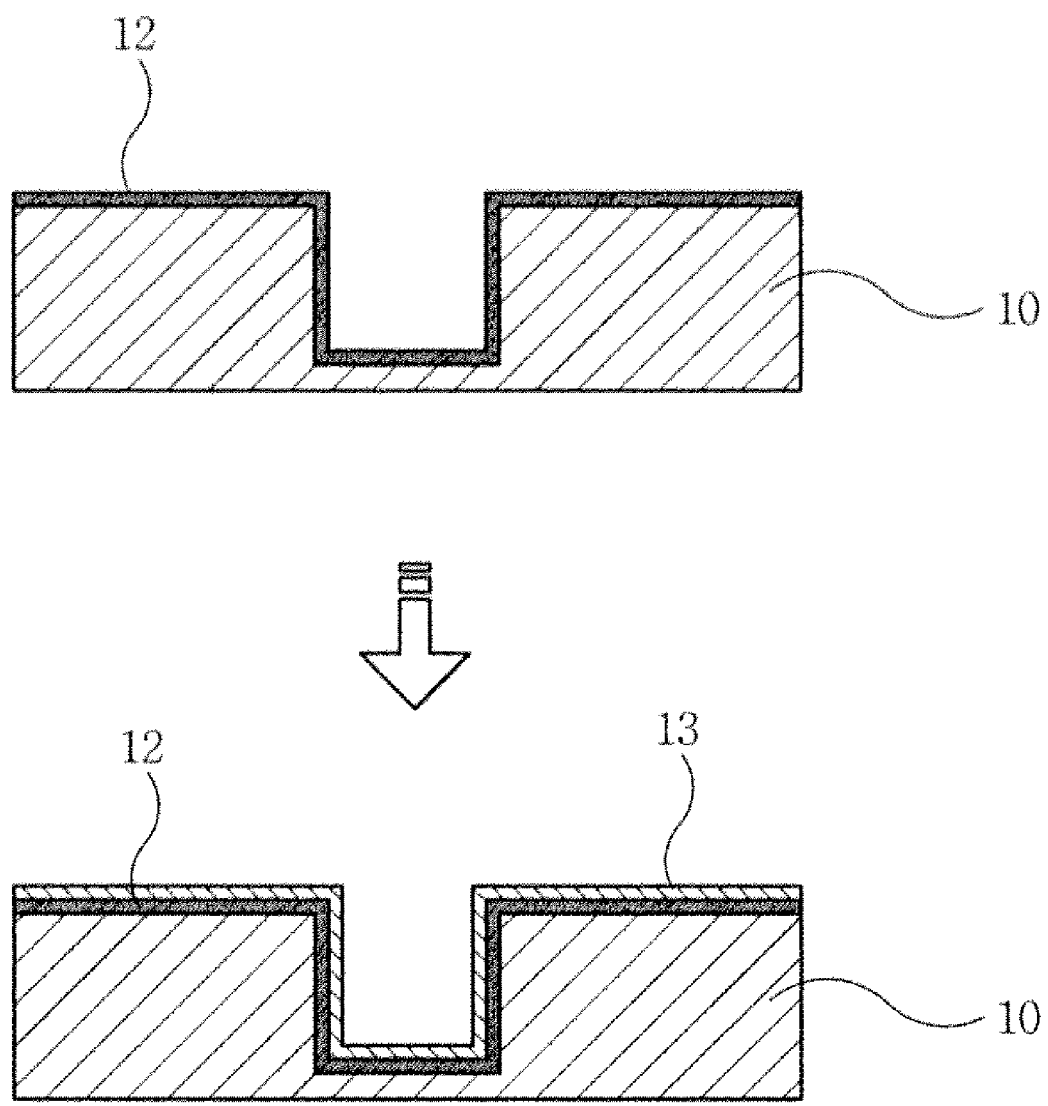
Figure 1C:
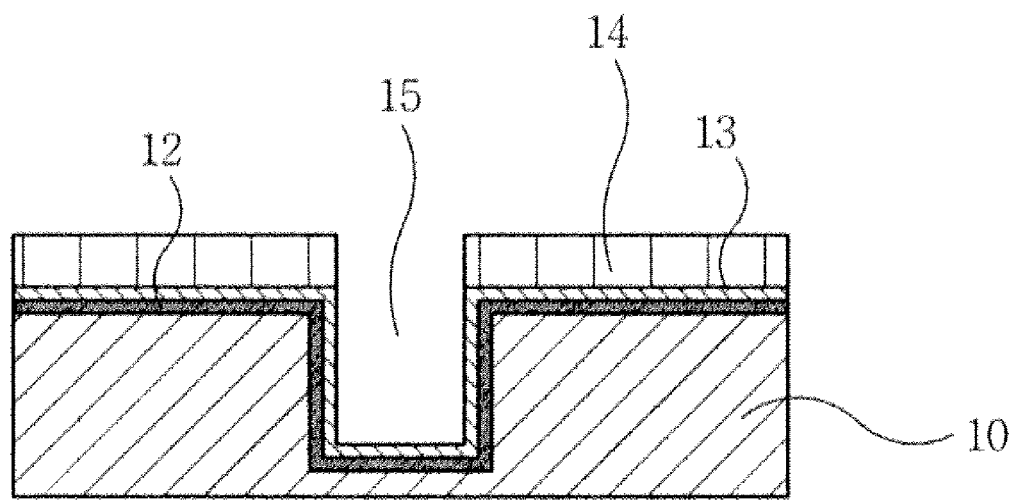
Figure 1C:
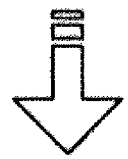
Figure 1C:
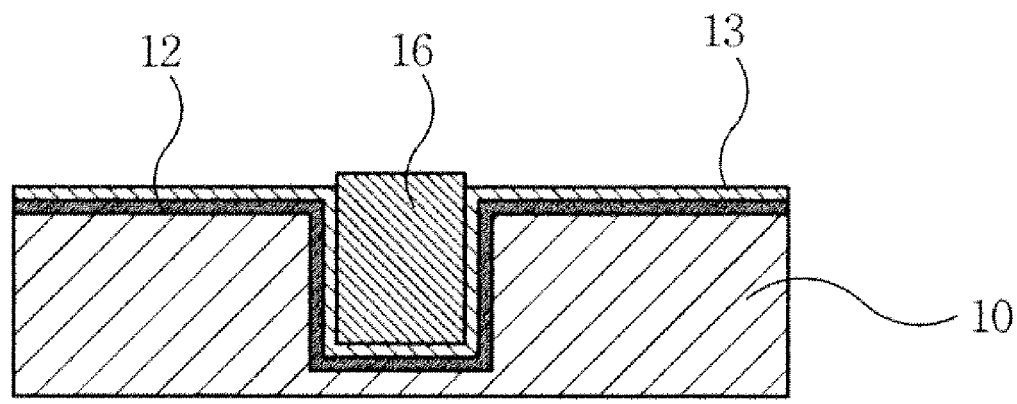
Figure 1D:
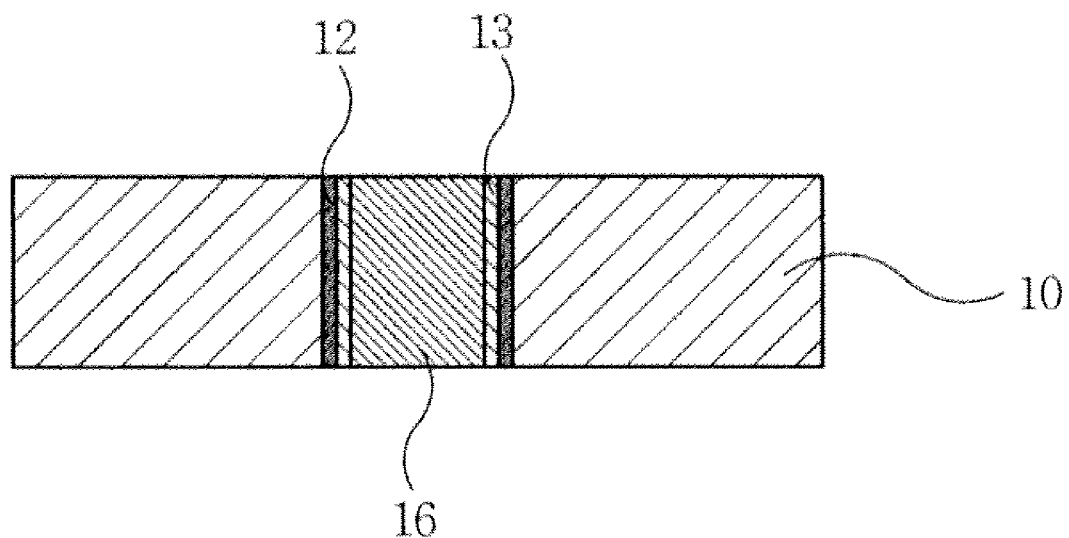

An example of a method of forming a general through-via is described as follows. First, as shown in FIG. 1A, a photoresist 11 is formed on a wafer 10, and then the photoresist 11 is subject to a laser process or a deep reactive ionized etching (DRIE) process, thereby forming a blind via 15. After that, the photoresist 11 is removed. As shown in FIG. 1B, an insulation layer 12 is formed through oxidation, and a metal seed layer 13 is formed on the insulation layer 12 through a sputtering, an evaporation or a gold plating. As shown in FIG. 1C, a photoresist 14 is formed, and a via core 16 is formed through a plating. Finally, as shown in FIG. 1D, the wafer 10 is polished through a chemical mechanical polishing (CMP), thereby forming a through-via.

Such a conventional through-via has a small thickness of about 2 μm to 3 μm, resulting in signal loss and noise in adjacent transmission lines.

As an example offered to prevent such as signal loss and noise, a method of forming a general through-via is provided in which a via core is insulated by forming polymer around the via core.

FIGS. 2A to 2E are cross sectional views showing a method of manufacturing a conventional through-via made of polymer.

Figure 2A:
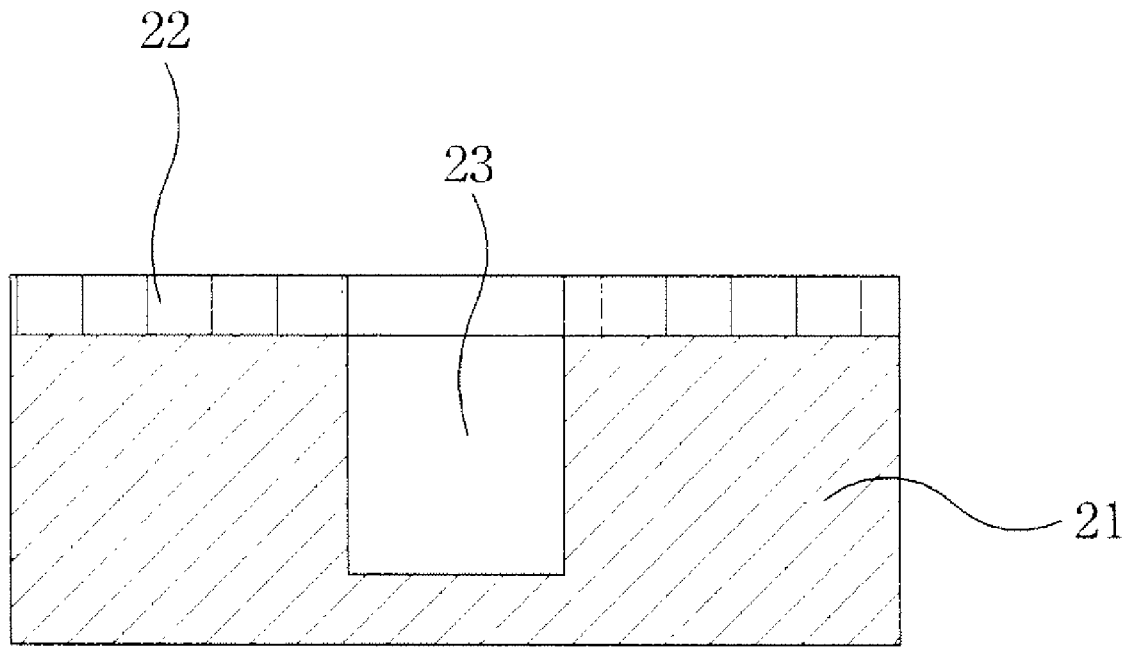
FIGS. 2A to 2E are cross sectional views illustrating a method of manufacturing a conventional through-via formed of polymer.
Figure 2A:
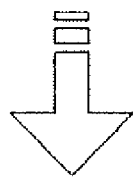
Figure 2A:
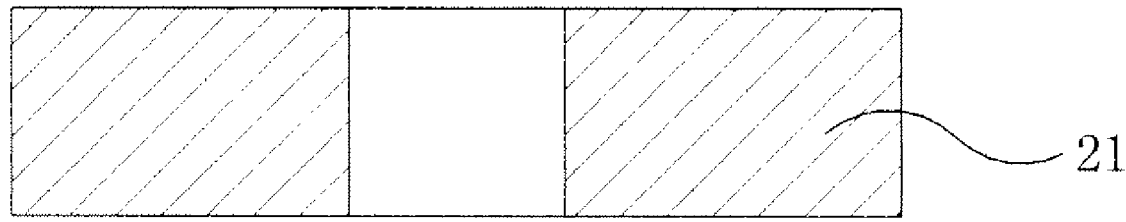

As shown in FIG. 2A, a photoresist 22 is formed on a wafer 21. After that, a polymer-via hole 23 is formed through a mask process, and the polymer-via hole 23 is subject to an etching process through a DRIE. After that, the wafer 21 is polished to form a blind via having both ends opened.

Figure 2B:
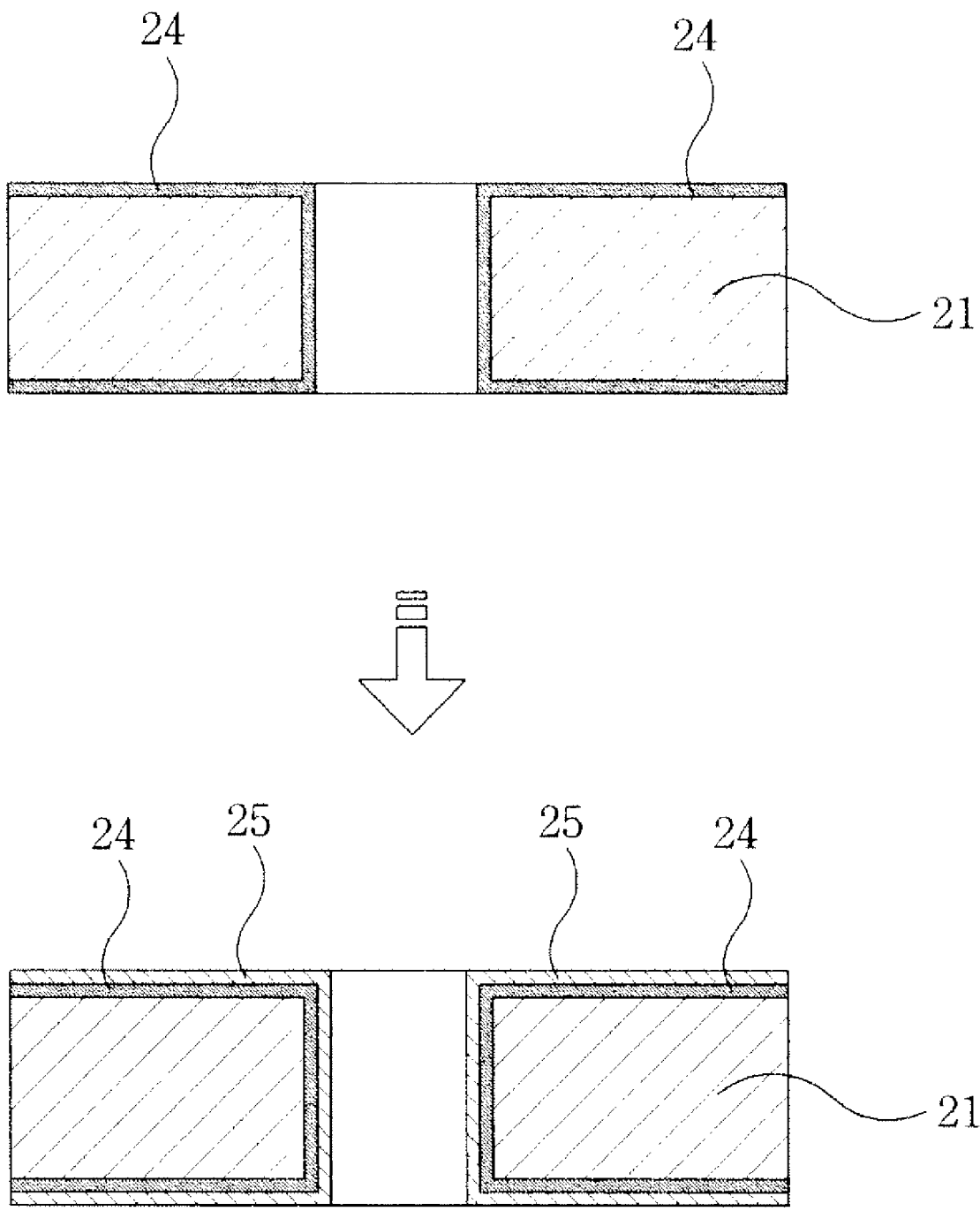
Figure 2C:
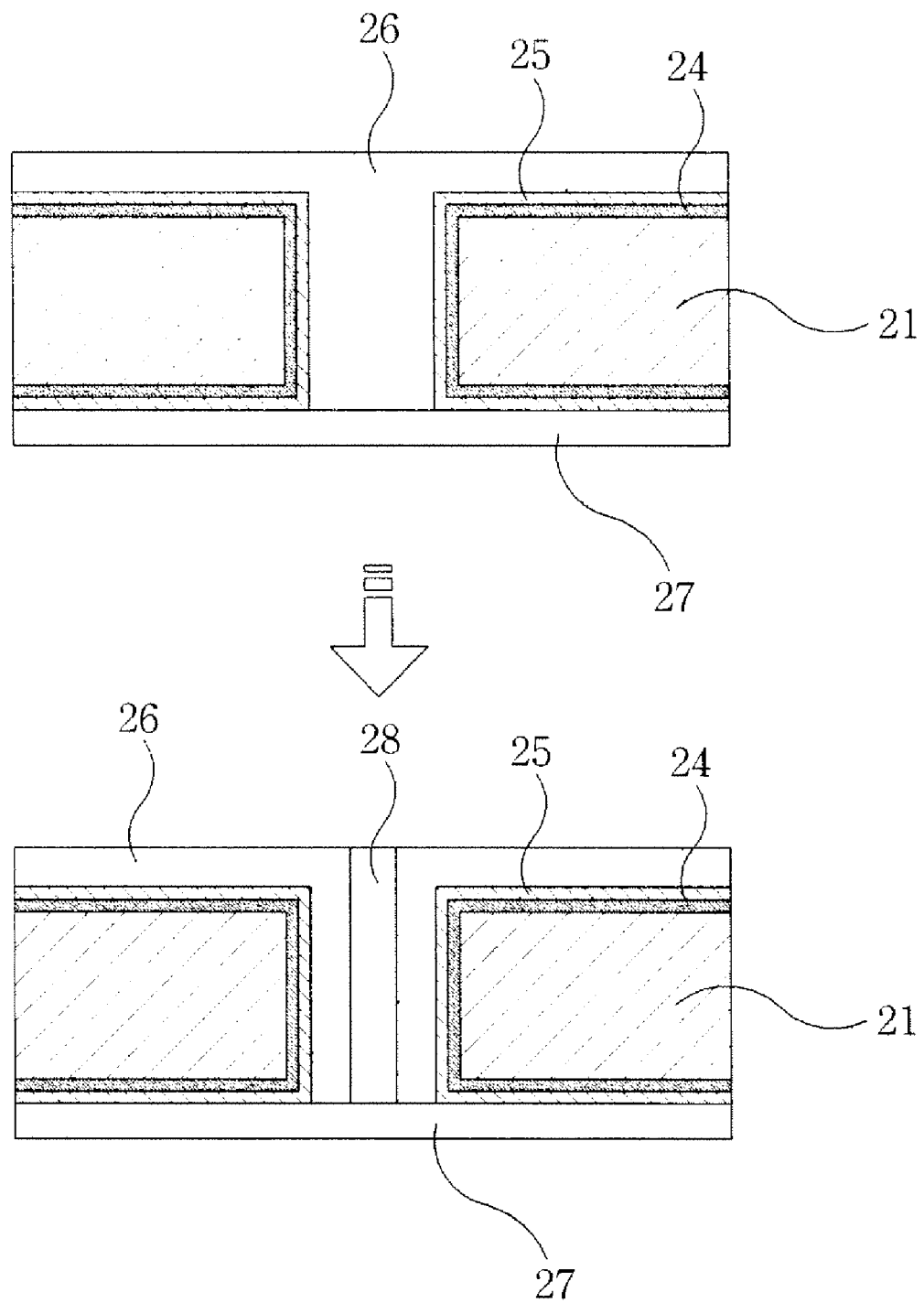
Figure 2D:
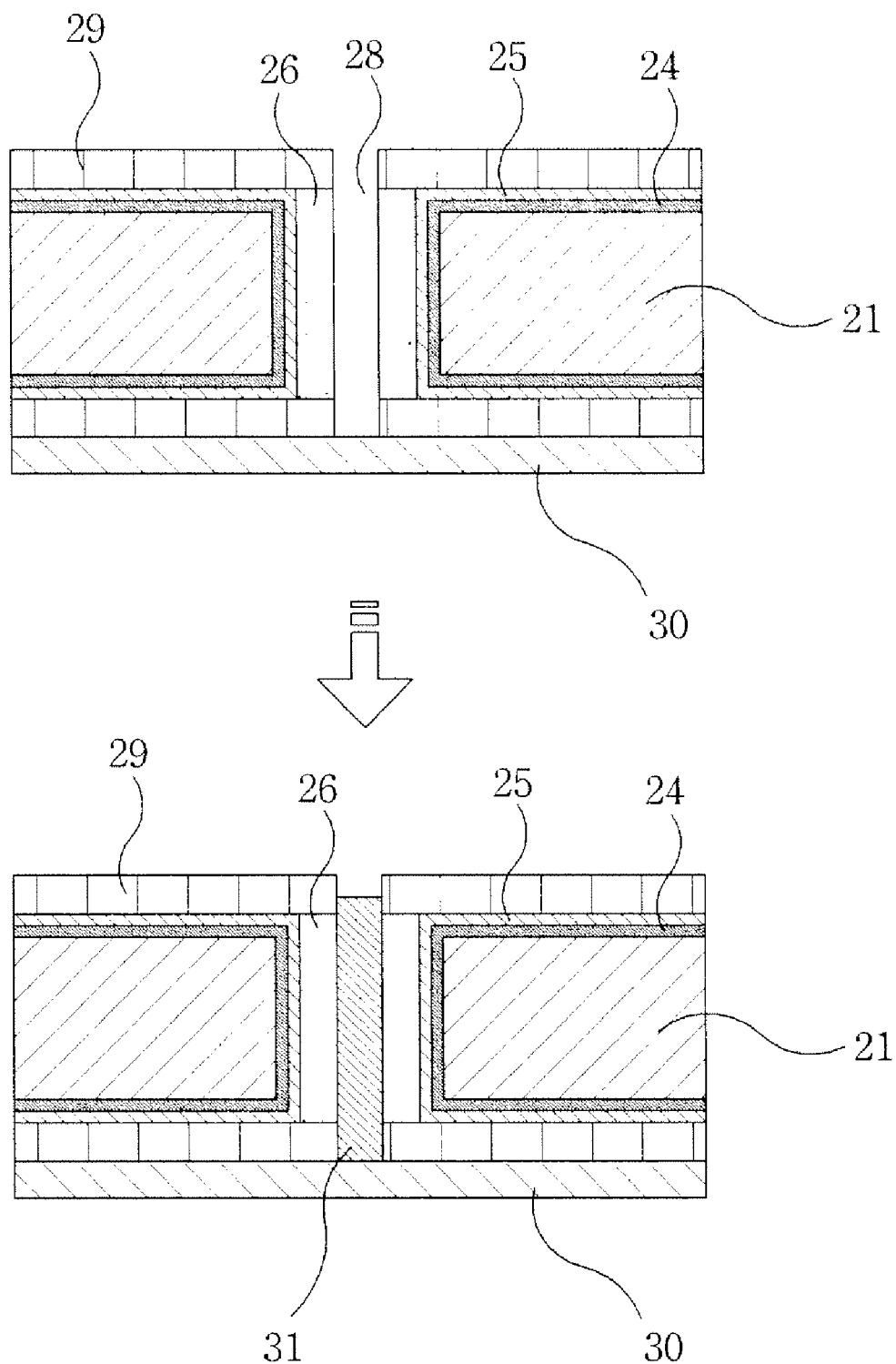
Figure 2E:
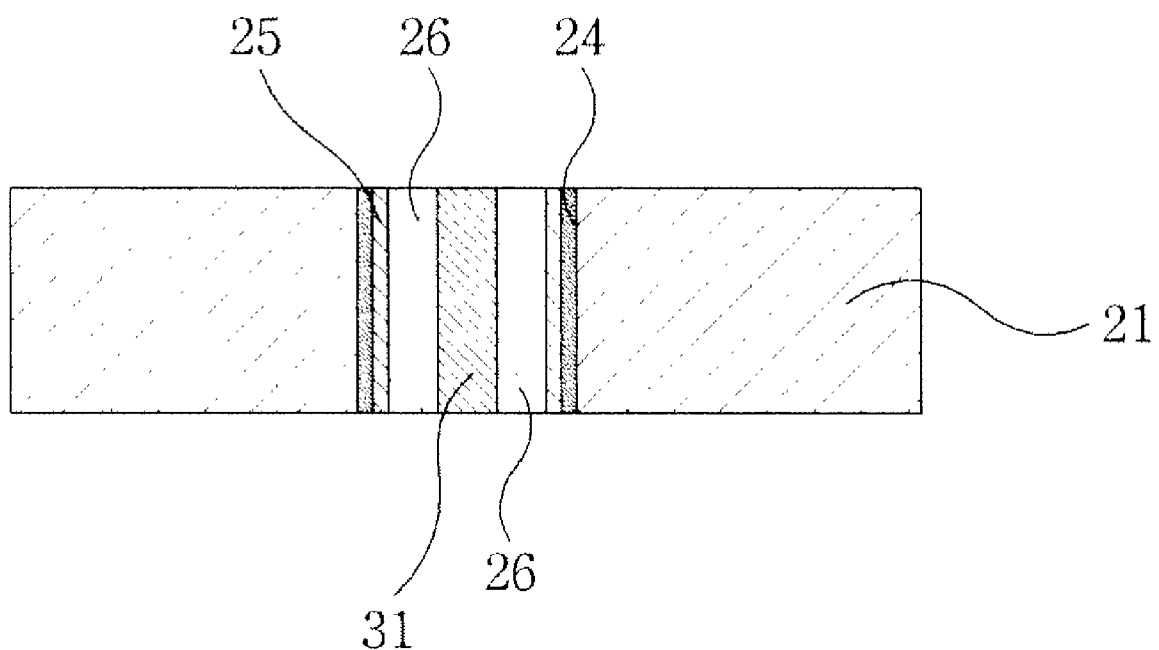

As shown in FIG. 2B, a metal insulation layer 24 including an oxidation layer is formed on the wafer 21. After that, a metal coating layer 25 is formed on the metal insulation layer 24 through a sputtering, an evaporating or a plating. As shown in FIG. 2C, an adhesion film 27 is attached to a lower surface of the wafer 21. After that, high resistive polymer solution 26 is filled in the polymer-via hole 23. A core-via hole 28 for forming a via core 31 (see FIG. 2D) is formed. As shown in FIG. 2D, the adhesion film 27 is separated from the wafer 21, and a photoresist 29 is formed on an upper surface and a lower surface of the wafer 21. A metal film 30 is thermally bonded to the wafer 21. After that, the via core 31 is formed in the core-via hole 28 through a plating. Finally, as shown in FIG. 2E, the wafer 21 is subject to polishing, and thus an insulation via is formed.

As described above, the via core 31 is formed after the polymer solution 26 has been cured. Accordingly, adhesion force between the cured polymer 26 and the via core 31 is low and thus cured polymer including the polymer solution 26 is easily separated from the via core 31. In general, the polymer solution 26, which has a high viscosity, is not easily filled in the polymer-via hole 28. Further, if the polymer-via hole 28 has a great depth, the filling of polymer into the via hole 28 becomes more complicated. In addition, air bubbles may be generated when the polymer solution 26 is filled into the via hole 28.

Hereinafter, a method of manufacturing an exemplary through-via will be described.

FIGS. 3A to 3F are cross sectional views illustrating an exemplary method of manufacturing a through-via.

The through-via manufacturing method is performed as follows. A core-via hole is formed in a wafer. A suction-via hole adjacent to the core via hole is formed in the wafer. A via core is formed in the core-via hole. A polymer-via hole connected to the suction-via hole is formed in the wafer. A vacuum is created inside the polymer-via hole by using the suction-via hole such that polymer solution is filled in the polymer-via hole. The wafer is polished such that the via core formed in the core-via hole is exposed.

Referring to FIGS. 3A to 3F, the through-via manufacturing method will be described in detail.

Figure 3A:
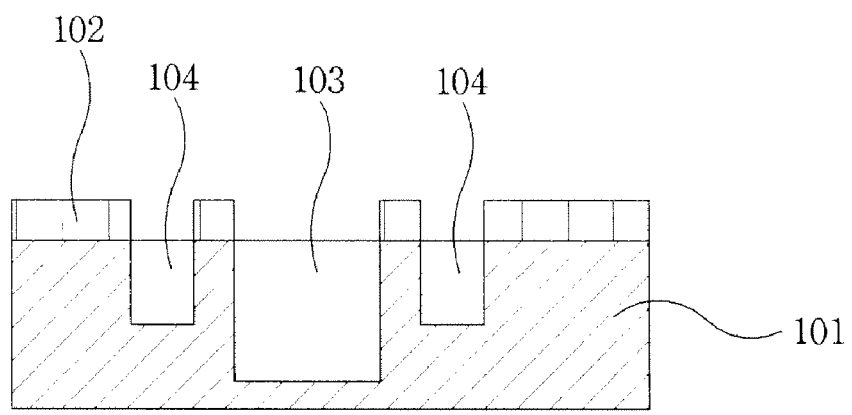
Figure 3B:
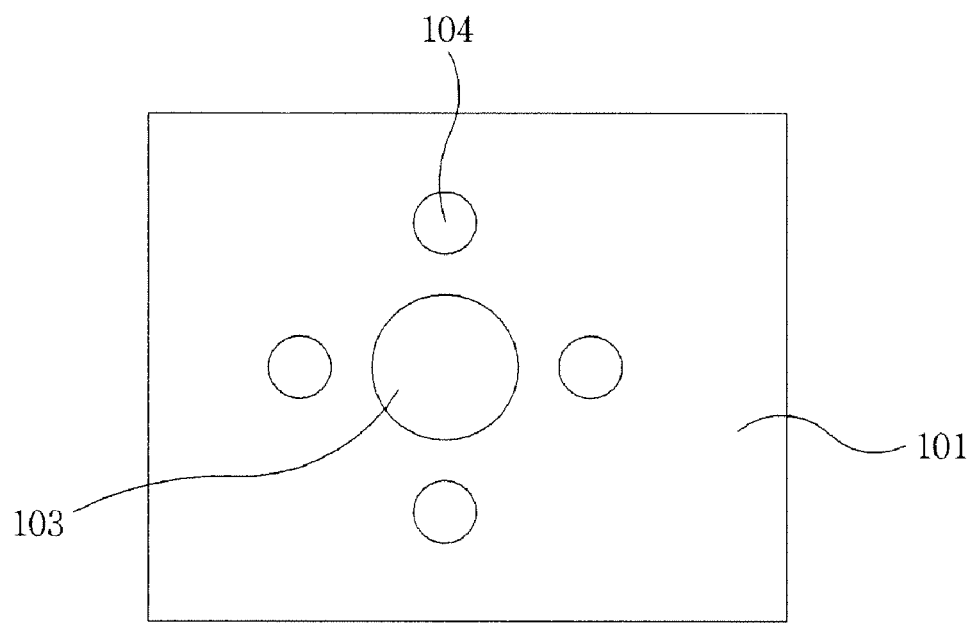
Figure 3C:
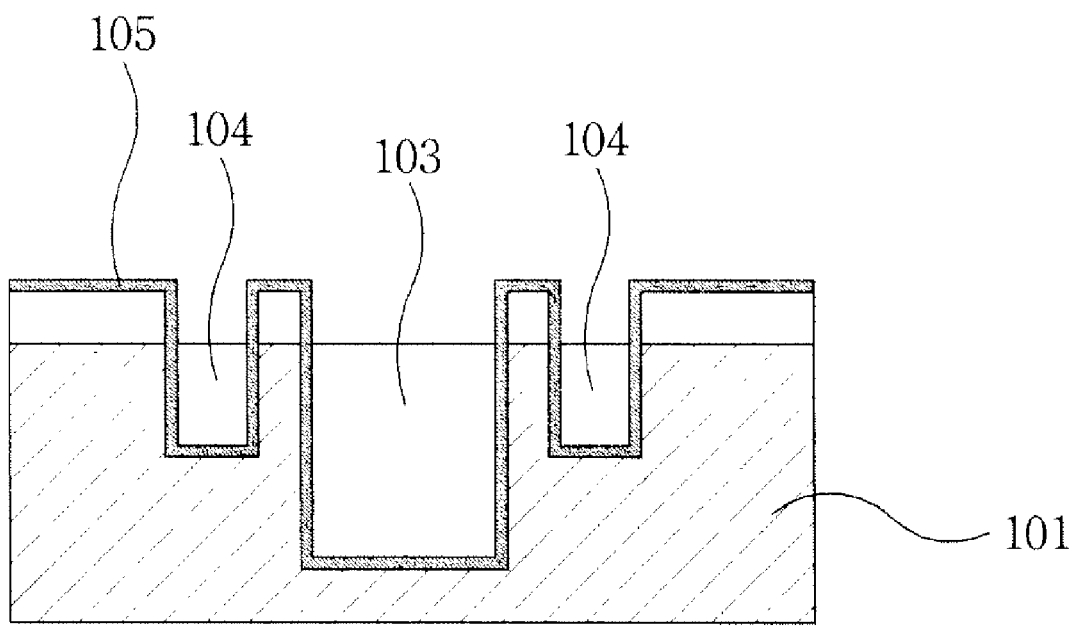
Figure 3C:
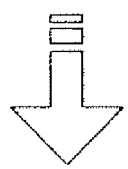
Figure 3C:
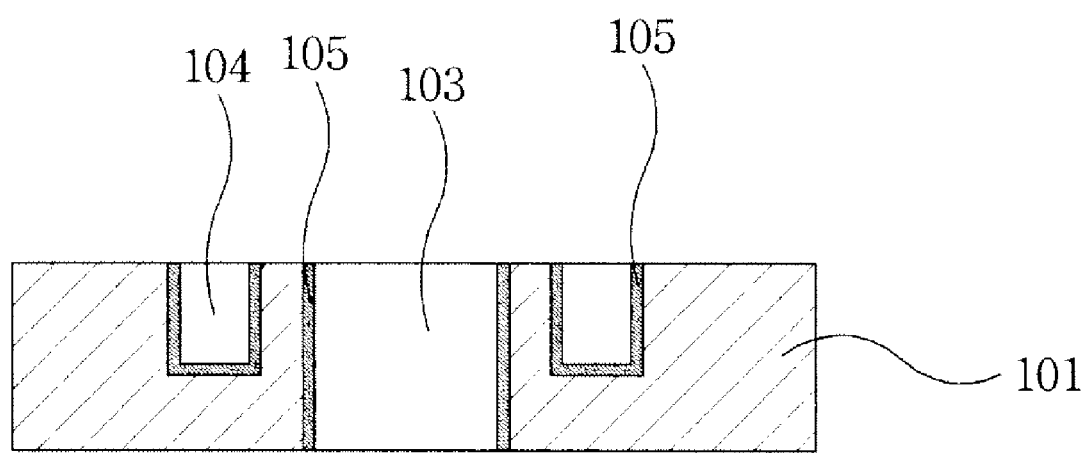

FIG. 3A is a cross sectional view showing a wafer in which a core-via hole and a suction-via hole are formed, and FIG. 3B is a plan view showing a wafer in which a core-via hole and a via hole for suction.

As shown in FIGS. 3A and 3B, a core-via hole 103 is formed in a wafer 101. After that, a suction-via hole 104 adjacent to the core-via hole 103 is formed in the wafer 101.

As an example, an etching may be performed when forming the core-via hole 103 and the suction-via hole 104 in the wafer 101. As shown in FIG. 3A, a photoresist 102 is applied to the wafer 101. Then, a mask (not shown) is disposed on the photoresist 102. An exposure and development is performed on the photoresist 102 and an etching is performed on the photoresist 102 through a DRIE, thereby forming the core-via hole 103 and the suction-via hole 104 having a blind via shape. Finally, the photoresist 102 is removed from the wafer 101.

Meanwhile, the core-via hole 103 has a depth proportional to a diameter of the core-via hole 103, and the suction-via hole 104 has a depth proportional to a diameter of the suction-via hole 104. If the core-via hole 103 has a large diameter, the core-via hole 103 has a large depth. If the suction-via hole 104 has a large diameter, the suction-via hole 104 has a large depth. For example, if the core-via hole 103 has a diameter greater than that of the suction-via hole 104, the core-via hole 103 has a depth greater than that of the suction-via hole 104, allowing the core-via hole 103 and the suction-via hole 104 to have different depths. Accordingly, the core-via hole 103 and the suction-via hole 104 can be simultaneously formed into different depths through a single exposure and development process and a single etching process in a manner to adjust the to diameters of the core-via hole 103 and the suction-via hole 104 corresponding to the depths of the core-via hole 103 and the suction-via hole 104. Accordingly, unnecessary exposure, development and etching processes may be omitted.

As another example of manufacturing the suction via hole 104, the core-via hole 103 and the suction-via hole 104 may be formed by radiating a laser beam. In this case, the core-via is hole 103 and the suction-via hole 104 are provided into a desired diameter and depth in a manner to adjust power. That is, the core-via hole 103 and the suction-via hole 104 have depths in direct proportional to the output of the laser beam.

Meanwhile, a plurality of the suction-via holes 104 may be formed in the wafer 101 with respect to a single core-via hole 103. As shown in FIG. 3B, the suction-via holes 104 are formed at predetermined angles around the core-via hole 103 while being spaced apart from each other. A via core (111, in FIG. 3D) is formed in the core-via hole 103, and a polymer layer including cured polymer solution (109, in FIG. 3E) is formed adjacent to the suction-via hole 104. As described above, since the suction-via holes 104 are formed at predetermined angles around the core-via hole 103 while being spaced apart from each other, the polymer layers (109, in FIG. 3E) is also formed around the via core (111, in FIG. 3D) while being spaced apart from each other at an equal interval.

Meanwhile, the core-via hole 103 has a depth greater than that of the suction-via hole 104. If the suction-via hole 104 has a depth equal to or larger than that of the core-via hole 103, the suction-via hole 104 is formed into a through-via rather than a blind via. In that case, metal may be unintentionally filled in the suction-via hole when the via core (111, in FIG. 3D) is formed.

After the suction-via hole 104 has been formed in the wafer 101, a metal seed layer 105 is formed on an inner surface of the core-via hole 103 and the suction-via hole 104. The metal seed layer 105 is used to form the via core (111, in FIG. 3D) to be described later.

After that, when the photoresist (102, in FIG. 3A) is removed from the wafer 101, the upper surface and the lower surface of the wafer 101 are polished such that both ends of the core-via hole 103 formed in the wafer 101 are exposed out of the wafer 101.

Figure 3D:
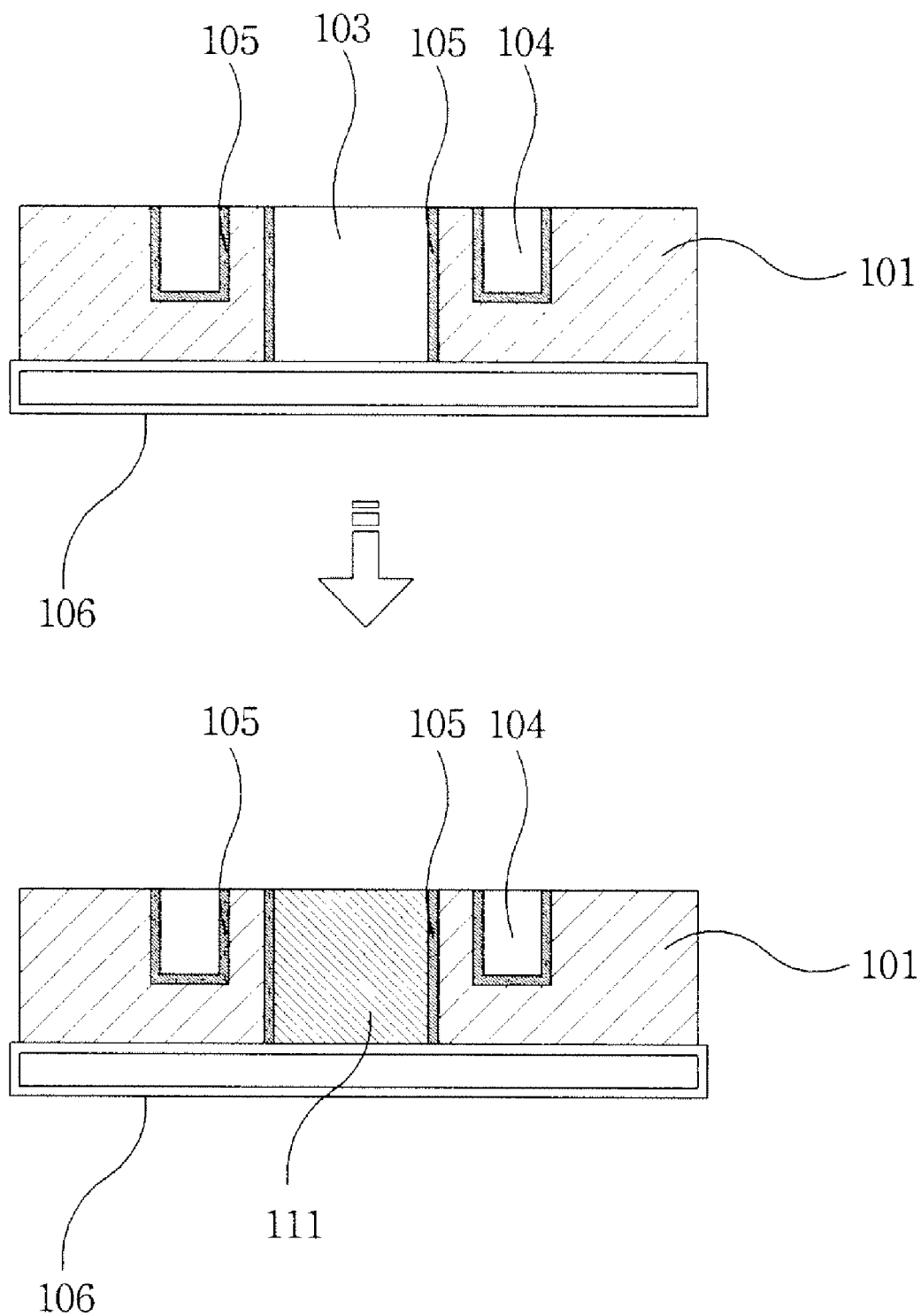

As shown in FIG. 3D, the via core 111 is formed into the core-via hole 103. The via core 111 is formed by thermally bonding a metal film 106 to one side of the wafer 101 to block one end of the core-via hole 103d, and then filling metal in the core-via hole 103. The metal is filled in the core-via hole 103 through a plating and may include any one selected from the group consisting of tin, copper and gold.

Figure 3E:
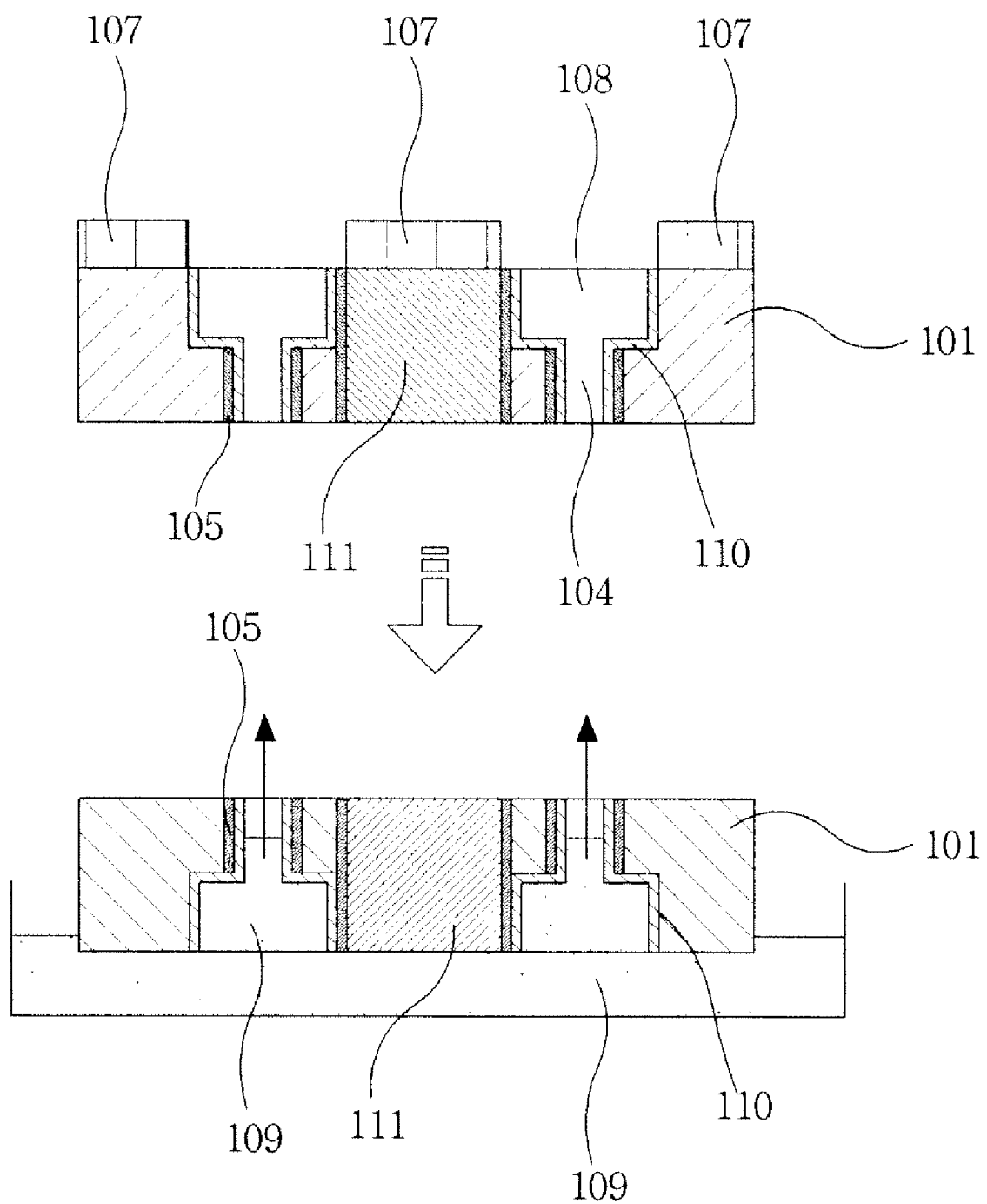

As shown in FIG. 3E, the polymer-via holes 108 connected to the respective suction-via holes 104 are formed in the wafer 101. The polymer-via holes 108 are formed by applying a photoresist 107 and then sequentially performing an exposure and development process and an etching process on the photoresist 107 using the photoresist 107 as a mask. Since the process of forming the polymer-via holes 108 is similar to that of core-via hole 103, the detailed description of the process will be omitted in order to avoid redundancy. Different from the core-via hole forming process, the polymer-via holes 108 is formed around the via core 111, allowing the polymer solution 109 cured in the polymer-via holes 108 to insulate the via core 111.

Meanwhile, after the polymer-via holes 108 connected to the suction-via holes 104 have been formed, a metal coating layer 110 may be formed on an inner wall of the polymer-via holes 108. Accordingly, a via having the same axis as the suction-via hole 104 is formed in the polymer-via hole 108. The metal coating layer 110 may be formed through a sputtering, an evaporation or a plating. The metal coating layer 110 may be omitted if the polymer-via hole 108 is used only for insulation.

After that, a vacuum is created inside the polymer-via hole 108 by using the suction-via hole 104 such that the polymer-via hole 108 is filled with polymer solution 109. In detail, as shown in FIG. 3E, the wafer 101 is turned upside down such that the polymer-via hole 108 is provided at a position lower than that of the suction-via hole 104. After that, a lower portion of the wafer 101 is dipped into a container filled with the polymer solution 109. Air remaining inside the suction-via hole 104 and the polymer-via hole 108 is removed by drawing air inside the suction-via hole 104 outside. As a result, the suction-via hole 104 and the polymer-via hole 108 have an inner air pressure lower than external air pressure, so that the polymer-via hole 108 is filled with the polymer solution 109. Then, the polymer solution 109 is cured into the polymer layer 109. The polymer solution 109 may include polymer filler having a resistance ranging from about $10^8$ $\Omega$cm to $10^{10}$ $\Omega$cm. Since the filler has a resistance higher than $10^4$ $\Omega$cm corresponding to a resistance of the wafer 101, the signal loss is minimized and high transmission speed is realized over 10 Gbps.

Figure 3F:
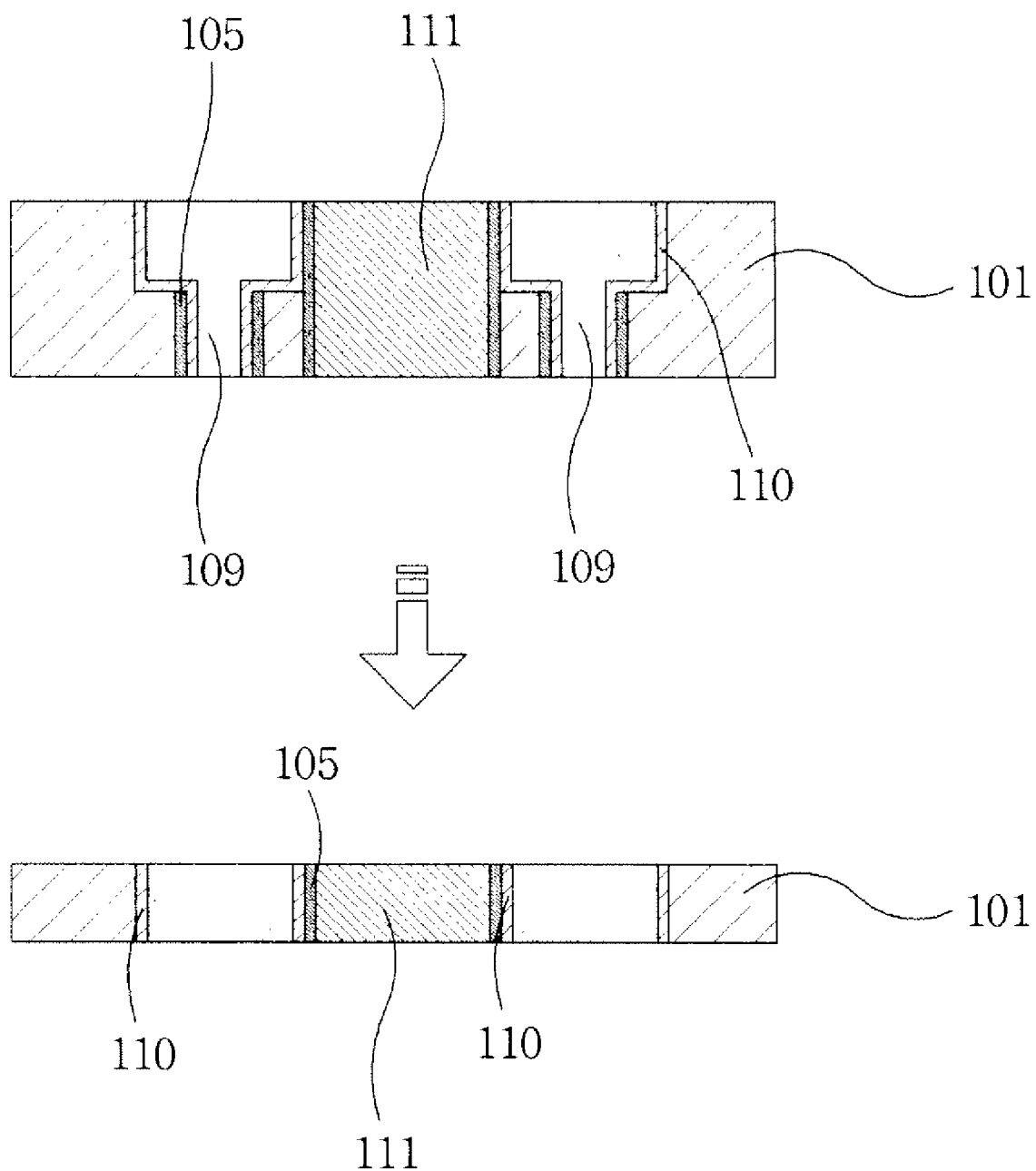

Finally, as shown in FIG. 3F, the wafer 101 is polished such that the via core 111 formed in the core-via hole 103 is exposed, thereby completing the process of forming the through-via.

According to the through-via manufacturing method, the polymer solution 109 is filled in the polymer-via hole 108 in a manner to create vacuum inside the polymer-via hole 108 by means of the suction-via hole 104. As a result, air remaining in the polymer-via hole 108 is removed and thus air bubbles are prevented from being generated in the polymer-via hole 108. Accordingly, polymer solution 109 can be uniformly filled in the polymer-via-hole 108.

According to the through-via manufacturing method, after the via core 111 has been formed, the polymer solution 109 in a liquid state is filled around the via core 111 and cured, so that adhesion force between the via core 111 and the polymer layer 109 is improved and the via core 111 is prevented from being separated from the polymer layer 109.

According to the conventional through-via manufacturing method described with reference to FIGS. 2A to 2E, after the polymer solution 109 has been filled, the core-via hole 28 to is subject to an exposure and development using a laser. Since the radiation distance of laser is limited due to characteristics of light such as scattering and absorption of light in the polymer solution 26, the depth the core-via hole 28 is not easily adjusted. However, according to the exemplary through-via manufacturing method, after the core-via hole 103 and the via core 111 have been formed, the polymer solution 109 is filled, so that the core-via hole 103 can be is provided into a desired depth.

According to the through-via, the polymer material 109 having a high resistance allows input/output signal loss to be reduced, so that high speed signal transmission can be realized over 10 Gbp. The through-via is applied to a high speed transmission line of optical transport components based on a silicon carrier, a planar optical waveguide and a silicon optical bench.

A number of exemplary embodiments have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A method of manufacturing a through-via, the method comprising:
   forming a core-via hole in a wafer;
   forming a suction-via hole adjacent to the core-via hole in the wafer;
   forming a via core in the core-via hole;
   forming a polymer-via hole connected to the suction-via hole in the wafer;
   filling the polymer-via hole with polymer solution by creating a vacuum inside the polymer-via hole by drawing air out of the suction-via hole; and
   polishing the wafer such that the via core formed in the core-via hole is exposed.

2. The method of claim 1, wherein the forming of the core-via hole in the wafer is performed simultaneously with the forming of the suction-via hole in the wafer.

3. The method of claim 1, wherein, after the suction-via hole has been formed in the wafer, a metal seed layer is formed on inner surfaces of the core-via hole and the suction-via hole.

4. The method of claim 1, wherein the core-via hole has a depth greater than a depth of the suction-via hole.

5. The method of claim 1, wherein the filling of the polymer-via hole with the polymer solution comprises:
   dipping a lower portion of the wafer into a container filled with the polymer solution in a state where the wafer is disposed such that the polymer-via hole is opened downward and the suction-via hole is opened upward;
   filling the polymer solution in the polymer-via hole by removing air inside the suction-via hole and the polymer-via hole in a manner to draw air of the suction-via hole to the outside; and
   curing the polymer solution.

6. The method of claim 1, wherein the forming of the core-via hole and the suction-via hole in the wafer comprises:
   forming photoresist on the wafer;
   performing exposure and development on the photoresist in a state where a mask is disposed on the photoresist and then etching the core-via hole and the suction-via hole; and
   removing the photoresist on the wafer.

7. The method of claim 6, wherein the core-via hole has a depth that is proportional to a diameter of the core-via hole.

8. The method of claim 6, wherein the suction-via hole has a depth that is proportional to a diameter of the suction-via hole.

9. The method of claim 6, wherein, in the removing of the photoresist from the wafer, an upper surface and a lower surface of the wafer are polished such that the core-via hole passes through the wafer.

10. The method of claim 1, wherein the forming of the core-via hole and the suction-via hole in the wafer is performed by radiating a laser beam to the wafer.

11. The method of claim 10, wherein the core-via hole and the suction-via hole have a depth that is proportional to output power of the laser beam.

12. The method of claim 1, wherein the polymer solution includes polymer filler having a resistance ranging from about $10^8$ Ωcm to $10^{10}$ Ωcm.

13. The method of claim 1, wherein the forming of the via core in the core-via hole comprises:
   blocking one end of the core-via hole by thermally bonding a metal film to one side of the wafer; and
   filling metal in the core hole.

14. The method of claim 13, wherein the filling of the metal in the core-via hole comprises plating with at least one selected from the group consisting of tin, copper and gold.

15. The method of claim 1, wherein, in the forming of the core-via hole and the suction-via hole, a plurality of suction-via holes are formed around the core-via hole.

16. The method of claim 14, wherein the suction-via holes are formed at predetermined angles around the core-via hole while being spaced apart from each other.

17. The method of claim 1, further comprising forming a metal coating layer at an inner wall of the polymer-via hole after forming the polymer-via hole connected to the suction-via hole.

* * * * *